US006552935B2

(12) United States Patent
Fasoli

(10) Patent No.: US 6,552,935 B2
(45) Date of Patent: Apr. 22, 2003

(54) DUAL BANK FLASH MEMORY DEVICE AND METHOD

(75) Inventor: Luca Giovanni Fasoli, Fremont, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/922,044

(22) Filed: Aug. 2, 2001

(65) Prior Publication Data

US 2003/0026130 A1 Feb. 6, 2003

(51) Int. Cl.$^7$ ............................................. G11C 16/04
(52) U.S. Cl. ............................ 365/185.33; 365/230.03; 365/230.02
(58) Field of Search ........................... 365/185.33, 207, 365/230.03, 230.02, 189.01, 189.04, 230.06

(56) References Cited

U.S. PATENT DOCUMENTS

| | | | |
|---|---|---|---|
| 5,245,572 A | 9/1993 | Kosonocky et al. | 365/189.02 |
| 5,732,017 A | 3/1998 | Schumann et al. | 365/185.11 |
| 5,815,456 A * | 9/1998 | Rao | 365/189.05 |
| 5,822,256 A | 10/1998 | Bauer et al. | 365/200 |
| 5,841,696 A | 11/1998 | Chen et al. | 365/185.11 |
| 6,016,270 A * | 1/2000 | Thummalapally et al. | 365/185.11 |
| 6,151,268 A * | 11/2000 | Yoshikawa | 365/230.03 |
| 6,154,821 A * | 11/2000 | Barth et al. | 365/233 |
| 6,307,795 B1 | 10/2001 | Blodgett | 365/200 |
| 6,320,800 B1 | 11/2001 | Saito et al. | 365/200 |
| 2001/0028584 A1 | 10/2001 | Nakayama et al. | 365/203 |
| 2002/0012282 A1 | 1/2002 | Saito et al. | 365/200 |
| 2002/0060934 A1 | 5/2002 | Choi et al. | 365/200 |

OTHER PUBLICATIONS

Intel Corp., *1.8 Volt Intel Wireless Flash Memory (W18) Preliminary Datasheet*, Oct. 2000, pp. 1–80.

\* cited by examiner

*Primary Examiner*—David Nelms
*Assistant Examiner*—Thong Le
(74) *Attorney, Agent, or Firm*—Lisa K. Jorgenson; Andre Szuwalski

(57) ABSTRACT

A user configurable dual bank memory device is disclosed. The memory device includes a plurality of core banks of memory cells and a set of storage elements having stored therein configuration information. The configuration may be used to configure or group core banks of memory cells together to form a dual bank memory device. The memory device includes control circuitry for preventing a memory read operation from being completed in a core bank or user-configured dual bank in which an ongoing memory modify (program or erase) operation is being performed. The memory device further includes a first set of sense amplifiers dedicated to performing sense amplification only during memory read operations, and a second set of sense amplifiers dedicated to performing sense amplification only during memory modify operations.

34 Claims, 4 Drawing Sheets

DUAL BANK FLASH MEMORY DEVICE AND METHOD

BACKGROUND OF THE INVENTION

1. Technical Field of the Invention

The present invention relates to a nonvolatile memory device, and particularly to a user-configurable, dual bank flash memory device.

2. Description of the Related Art

The first nonvolatile memories were electrically programmable read-only memories (EPROMs). In these memories, the memory cells include a floating-gate transistor that is programmable using the hot carrier effect. Programming of an EPROM memory cell includes applying a potential difference between the drain and the source of the floating gate transistor in the presence of a high potential difference (of about 20 volts, this value varying according to the desired programming speed) between the control gate and the source. The application of the first of these potential differences generates an electrical field that gives rise to a flow of electrons in the channel. These electrons collide with atoms of the channel, causing the appearance of new free electrons. These electrons have very high energy (hence the term "hot carriers"). The high difference in potential between the control gate and the source of the floating gate transistor gives rise to a strong electrical field between the floating gate and the substrate, the effect of which is that certain of these electrons are injected into the floating gate, thus putting the memory cell in a state known as a "programmed" state.

The fact that the programming of a memory cell requires the application of voltages both to the control gate and to the drain of the floating-gate transistor eliminates the need for the use of a selection transistor to program one particular memory cell without programming the others. This results in a relatively small silicon area and the effectuation of large scale integration. By contrast, the erasure of all the memory cells of the memory is done substantially simultaneously by exposing the memory cells to ultraviolet radiation.

In addressing the need to individually erase EPROM memory cells, electrically erasable programmable read only memories (EEPROMs) were created. These memories are electrically programmable and erasable by tunnel effect (i.e., the Fowler Nordheim effect). The memory cells have a floating-gate transistor whose drain is connected to the bit line by a selection transistor. The gate of the selection transistor is connected to the word line. The gate of the floating-gate transistor is controlled by a bias transistor. Generally, the source of the floating gate transistor is connected to a reference potential, such as ground. These floating-gate transistors have an oxide layer between the substrate and the floating gate that is very thin to enable the transfer of charges by tunnel effect. The advantage of EEPROMs as compared with EPROMs lies in the fact that each memory cell is programmable and erasable independently of the other EEPROM cells. The tradeoff here is that a larger surface area of silicon is required and therefore a smaller scale of integration is achieved.

A third type of memory has more recently gained popularity. This type of memory, flash EPROMs, combines the relatively high integration of EPROMs with the ease of programming and erasure of EEPROMs. Flash memory cells can be individually programmed utilizing the hot carrier effect in the same way as EPROM cells are programmed. Flash memory cells are also electrically erasable by the tunnel effect. The memory cells of a flash EPROM memory includes a floating-gate transistor that has an oxide layer whose thickness is greater than the oxide layer thickness of an EEPROM floating gate transistor but smaller than the oxide layer thickness of an EPROM floating gate transistor. Consequently, the flash memory cell is capable of erasure by the tunnel effect. For erasure, a highly negative potential difference is created between the control gate and the source of the floating gate transistor, the drain being left in the high impedance state or connected to the ground potential so that a high electrical field is created which tends to remove the electrons from the floating gate.

Flash EPROM devices, hereinafter referred to as flash memory devices, typically include at least one array of flash memory cells organized into rows and columns of flash memory cells. The array is typically partitioned into blocks, each of which is further divided into sectors. A row decoder and column decoder are used to select a single row and at least one column of memory cells based upon the value of an externally generated address applied to the flash memory device. Sense amplifiers are coupled to the column lines corresponding to the columns of memory cells to amplify the voltage levels on the addressed column lines corresponding to the data values stored in the addressed flash memory cells. The particular implementations of the array and the row and column decoders are known in the art and will not be described further for reasons of simplicity.

Because memory modify operations (memory program or memory erase operations) typically take a good deal of time to execute, relative to memory read operations, flash memory devices have been implemented as dual bank memory devices in order to be able to perform memory read operations while a memory modify operation is being performed. In a conventional dual bank flash memory, the array of memory cells is partitioned into two independently accessible banks. The partitioning of the array into the two banks is performed during device fabrication and particularly at metalization. In other words, the metal masks determine the partitioning of the array.

A known dual bank flash memory is illustrated in FIG. 1. In this flash memory device, the array A of memory cells is capable of being partitioned to provide a 1/8-7/8, 1/4-3/4 or 1/2-1/2 dual bank ratio. Sense amplifiers SA are likewise partitioned to correspond to the partitioning of the array A. Each bank is associated with a distinct row decode circuitry RD and column decode and/or predecode circuitry CD. The decode circuitry of each bank is capable of receiving a predecoded address corresponding to a memory read operation or a memory modify operation (i.e., a memory read or a memory erase operation). The address for the memory read operation is provided by read address circuitry RAC, such as an address register, that is coupled to the address input of the memory device. The address for the memory modify operation is provided to each decoder circuit by an address counter AC having an input coupled to the address input of the memory device. A control circuit CC controls the various circuits of the flash memory device so as to execute memory read and memory modify operations.

Because array A is partitioned during device fabrication by using any of a plurality of metal mask sets, one shortcoming of prior dual bank flash memory devices is that the user is unable to partition array A as desired in the field. In addition, the costs of fabrication are heightened due to the multiple sets of metal masks having to be available for use during fabrication. Based upon the foregoing, there is a need for a dual bank flash memory device that allows greater flexibility in partitioning at reduced costs.

SUMMARY OF THE INVENTION

Embodiments of the present invention overcome shortcomings in prior nonvolatile memory devices and satisfy a significant need for a nonvolatile memory device having multiple core banks that are relatively easily and inexpensively configured into two banks so as to form a dual bank memory device. The two dual banks may be configured to have different sizes. The core banks are user configurable using programmable logic, thereby eliminating the need for multiple sets of metal masks to define bank configuration.

The nonvolatile memory device includes more than two core banks of nonvolatile memory cells. Memory cells in each core bank are arranged in addressable rows and columns of nonvolatile memory cells. The memory device further includes a plurality of address decode circuits, each address decode circuit being associated with a distinct core bank of nonvolatile memory cells and adapted to connect addressed memory cells to a plurality of column lines in the core bank. Nonvolatile storage elements are capable of maintaining memory bank configuration information. The memory device includes control circuitry for grouping the core banks of nonvolatile memory cells into at least two groups of core banks based upon the memory bank configuration information, and controlling the address decode circuits, sense amplifiers and the data output circuitry so that each group of core banks is capable of being individually accessed for performing memory read and memory modify operations on memory cells in the group.

The nonvolatile memory device further includes a first set of sense amplifiers dedicated to performing sense amplification only during memory read operations, and a second set of sense amplifiers dedicated to performing sense amplification only during memory modify operations.

A method of operating a flash memory in accordance with an exemplary embodiment of the present invention includes initially maintaining bank configuration information corresponding to grouping of the core banks of nonvolatile memory cells, and grouping the core banks of nonvolatile memory cells based upon the bank configuration information so as to form at least two independently accessible groups of nonvolatile memory cells that are each capable of having memory read operations and memory modify operations performed on nonvolatile memory cells therein. Next, core banks of memory cells are controlled so that a memory read operation may be performed on one of the groups of core banks while a memory modify operation is being performed on another of the groups of core banks.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF AN EXEMPLARY EMBODIMENT OF THE PRESENT INVENTION

The present invention will now be described more fully hereinafter with reference to the accompanying drawings in which an exemplary embodiment of the invention is shown. This invention may, however, be embodied in many different forms and should not be construed as being limited to the embodiment set forth herein. Rather, the embodiment is provided so that this disclosure will be thorough and complete, and will fully convey the scope of the invention to those skilled in the art.

Figure 2A:
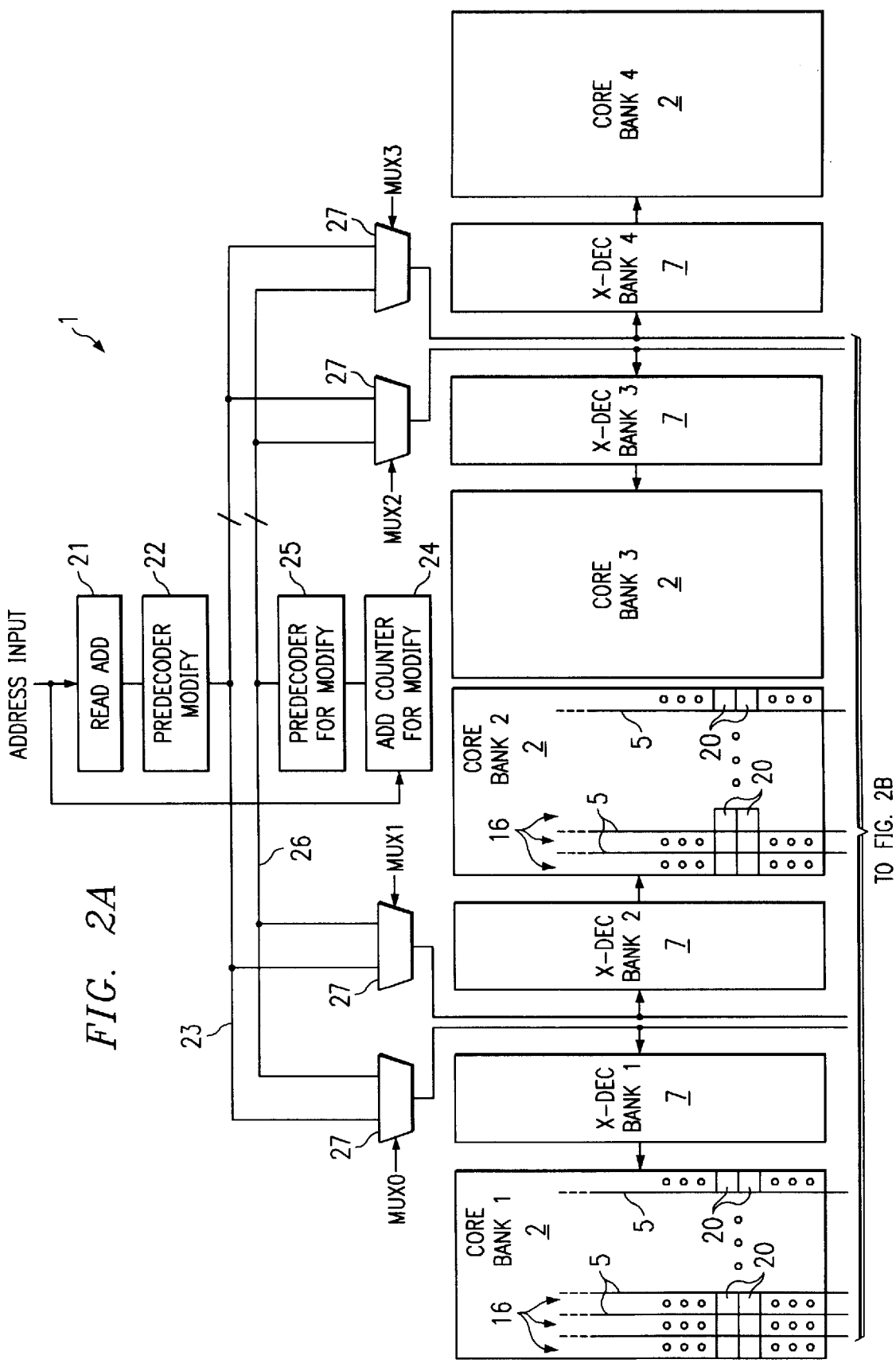
FIG. 2 is a block diagram of a nonvolatile memory device according to an exemplary embodiment of the present invention.
Figure 2B:
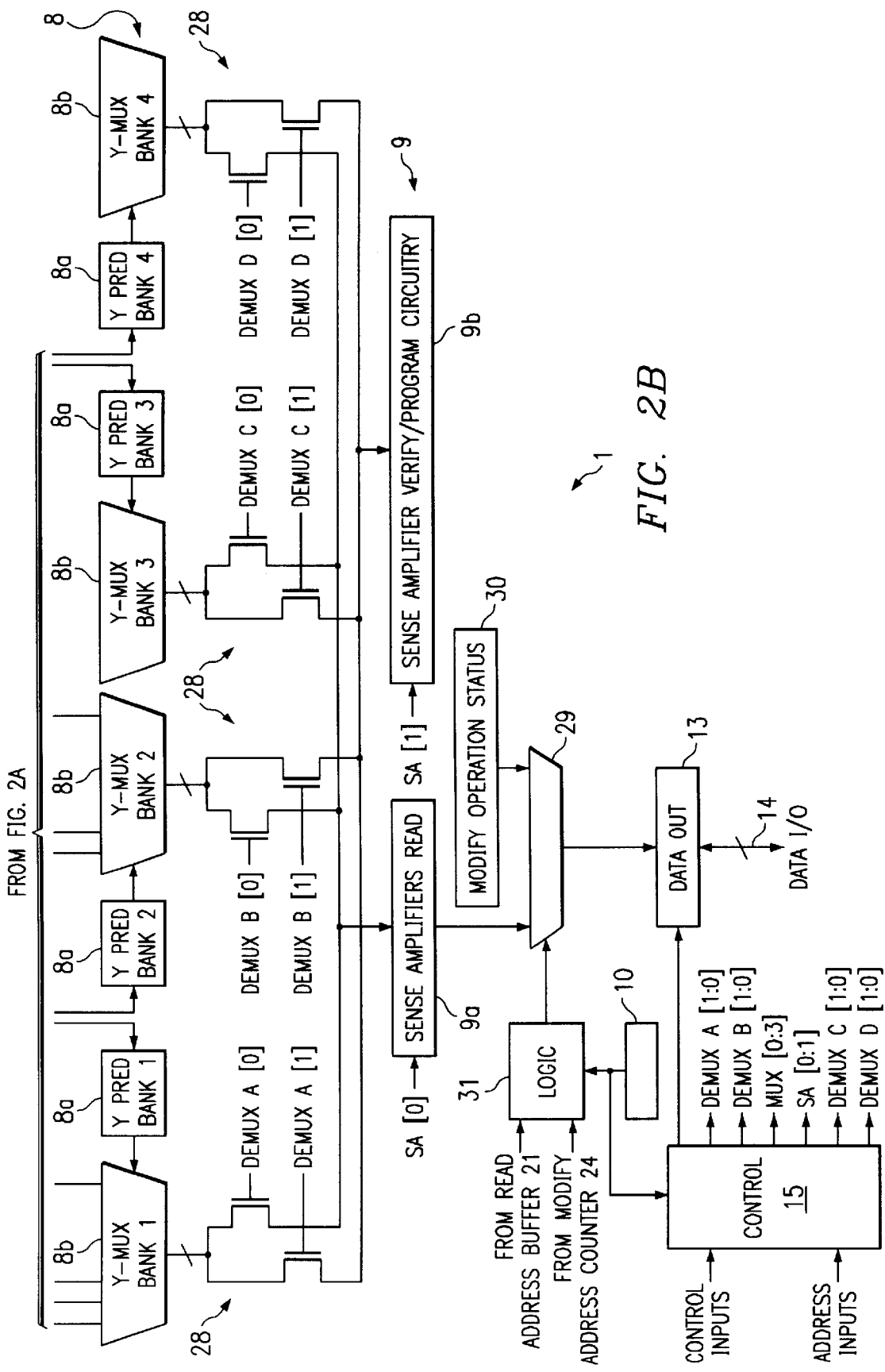

Referring to FIG. 2, there is disclosed a nonvolatile memory device 1 according to an exemplary embodiment of the present invention. It is understood that memory device 1 may be any type of nonvolatile memory device, such as a bilevel or multilevel flash memory device. Memory device 1 will be described below as a flash memory device for reasons of simplicity.

Figure 1:
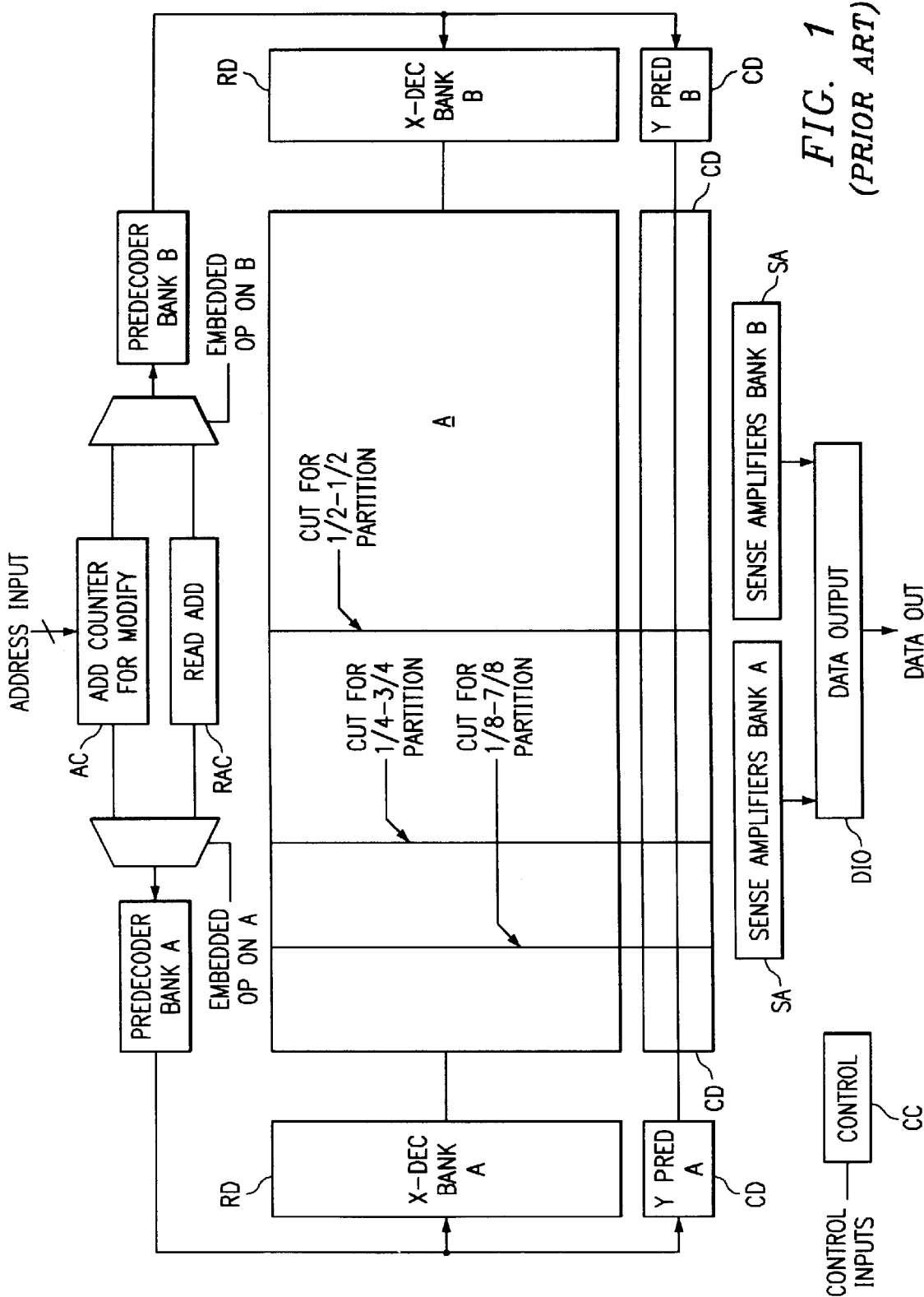
FIG. 1 is a block diagram of a known dual bank flash memory device.

Flash memory device 1 includes a plurality of core banks 2 of memory cells 20. Each core bank 2 of memory cells 20 may be arranged into rows and columns 16 of memory cells 20. The size of core banks 2 may vary relative to each other. Although flash memory device 1 is illustrated in FIG. 1 as having four core banks 2 of memory cells 20, it is understood that flash memory device 1 may include virtually any number of core banks 2 of memory cells 20.

Core banks 2 are shown in FIG. 2 as being relatively sparsely populated with memory cells 20 for reasons of clarity. It is understood that each core bank 2 is substantially entirely populated with memory cells 20 arranged in rows and columns of memory cells 20 as described above. Although memory cells 20 are described herein as flash memory cells, it is understood that memory cells 20 may be other types of non-volatile memory cells.

Despite flash memory device 1 being described and illustrated as including more than two core banks 2, core banks 2 are nonetheless capable of being configured or grouped to form a dual (two) bank flash memory device, with each dual bank being formed by a group of one or more core banks 2. In particular, flash memory device 1 may include one or more nonvolatile storage elements 10 which is adapted to store a value indicative of how core banks 2 are to be combined or grouped with each other in order to form the two dual banks. The value stored in the nonvolatile storage elements 10 is utilized within flash memory device 1 so as to ensure that no more than one memory access operation is performed on a dual bank at a time. The utilization of the value stored in nonvolatile storage elements 10 will be described in greater detail below. As stated above, core banks 2 may have different sizes (i.e., number of memory cells 20) relative to each other. This gives the potential for grouping the core banks 2 so that the ratio of the size of one dual bank to the size of the other dual bank may be any of a plurality of different ratio amounts. Nonvolatile storage elements 10 may be programmed by a user so as to result in a dual bank flash memory device 1 having user configurable dual bank sizes.

The memory cells 20 in each column 16 in a core bank 2 may be connected to a distinct column line 5, and the memory cells 20 in each row of memory cells 20 in a block or sector may be connected to a distinct row line. Column lines 5 may be local column lines that are coupled to main column lines (not shown in FIG. 2) for providing the selected local column lines to the periphery of array 2. The use of local and main column lines in flash memories are known in the art and will not be described in greater detail for reasons of simplicity.

Flash memory device 1 may further include address circuitry for providing to core banks 2 a predecoded address for a memory read operation (hereinafter a "read address")

and a predecoded address for a memory modify operation (hereinafter a "modify address"). In particular, the address circuitry may include a read address buffer 21 having an input coupled to the input address of flash memory device 1 and adapted to receive an externally generated address for a memory read operation. It is understood that read address buffer 21 may, for instance, include a counter in order to perform in a burst mode. A read predecoder circuit 22 receives the output of read address buffer 21 and generates a predecoded address signal 23 for a memory read operation.

Further, the address circuitry may include a modify address counter 24 having an input coupled to the input address of flash memory device 1. Modify address counter 24 is adapted to receive an externally generated address for a memory modify operation and increment/decrement the address value stored in modify address counter 24. In this way, modify address counter 24 is capable of generating successive address values for use in performing memory program and memory erase operations. A modify predecoder circuit 25 receives the address stored in modify address counter 24 and generates a predecoded address signal 26 for use in a memory modify operation.

It is understood that instead of flash memory device 1 having a read predecoder circuit 22 and modify predecoder circuit 25, each core bank 2 may have a separate predecoder circuit associated therewith.

The address circuitry may further include a plurality of multiplexer circuits 27, each of which receives the predecoded address signals 23 and 26 and provides one of the predecoded address signals to a distinct core bank 2. The particular address signal provided to a core bank 2 by a multiplexer circuit 27 is based upon the type of memory access operation, a memory read operation or a memory modify operation, to be performed on the core bank 2 of memory cells 20. Multiplexer circuit 27 is controlled so that no more than one multiplexer circuit 27 provides to its corresponding core bank 2 the predecoded address signal 26 at a time. Multiplexer circuit 27 allows for memory read operations to be continuously performed in a dual bank while a memory modify operation is being simultaneously performed in the other dual bank, as will be described in greater detail below.

Each core bank 2 in flash memory device 1 may be associated with a distinct row decode circuit 7 which may receive a predecoded address or portion thereof from a multiplexer circuit 27 and responsively selects and/or activates a row of memory cells 20 based upon the received predecoded address. In particular, the memory cells 20 in the selected row in a core bank 2 are selected by being connected to column lines 5 in the core bank 2. Row decode circuitry 7 for a core bank 2 may include logic that, for example, in response to receiving a predecoded address, drives a single row line corresponding to the address to a first voltage level to activate each memory cell 20 in the row, while driving the remaining row lines in the core bank 2 to another voltage level to deactivate the memory cells 20 in the remaining rows. Row decode circuitry 7 may be implemented with boolean logic gates as is known in the art.

Further, each core bank 2 of flash memory device 1 may be associated with a distinct column decode circuit 8 which receives a predecoded address or portion thereof from a multiplexer circuit 27, selects one or more local column lines 5 corresponding to the predecoded address for connection to signal conditioning circuitry external to core bank 2. Column decode circuitry 8 for a core bank 2 may be implemented as a column predecoder circuit 8a which receives a predecoded address from a multiplexer circuit 27, and multiplexing circuitry 8b connected to each local column line 5 in the corresponding core bank 2 of memory cells 20 and controlled by the output of column predecoder circuit 8a. In this way, the data value maintained in one or more addressed memory cells 20 are provided to the periphery of core banks 2 for subsequent signal conditioning.

Flash memory device 1 may include sense amplifiers 9 that sense the voltage levels appearing on the selected column lines 5 corresponding to the data stored in the addressed memory cells 20, and drive sense amplifier output signals to voltage levels that are more easily interpreted or otherwise handled by circuitry external to core bank 2.

According to the exemplary embodiment of the present invention, sense amplifiers 9 are grouped into a first set of sense amplifiers 9a that are dedicated to only performing signal amplification for memory read operations in any core bank 2, and a second set of sense amplifiers 9b that are dedicated to only performing signal amplification for memory modify operations in any core bank 2. Each core bank 2 may be associated with a distinct demultiplexing circuit 28 coupled between core bank 2 and sense amplifiers 9, so that selected column lines 5 (selected by column decode circuitry 8) are selectively connected to any of sense amplifiers 9a and 9b based upon the type of memory access operation being performed on the corresponding core bank 2. In this way, the data values are provided to the appropriate set of sense amplifiers 9. Each demultiplexing circuit 28 is controlled using a separate pair of control lines Demux[1:0]. Demultiplexer circuitry 28 is controlled so that the column lines 5 of no more than one core bank 2 are connected to sense amplifiers 9b at a time.

Flash memory device 1 may include a data input/output (I/O) circuit 13 that generally couples the output of the first set of sense amplifiers 9a (the sense amplifiers associated with memory read operations) to data I/O pins 14 of flash memory device 1. Specifically, the output of the first set of sense amplifiers 9a are coupled to data I/O pins 14 via a multiplexer circuit 29. A first input of multiplexer circuit 29 is connected to the output of sense amplifiers 9a.

Flash memory device 1 further includes a control circuit 15 for receiving input control signals and controlling the various components of flash memory device 1 to perform memory read and memory modify operations. For instance, control circuit 15 may generate timing/control signals for controlling row decode circuitry 7, column decode circuitry 8, demultiplexing circuits 28, sense amplifiers 9, and data I/O circuit 13 during a memory access operation.

Control circuit 15 and circuitry associated therewith are capable of ensuring that no more than one memory modify operation occurs at one time, and that a memory read operation in a user-configured dual bank may not occur if a memory modify operation is being performed in the same user-configured dual bank. With respect to the latter, if it is determined that a memory read operation is in one of the user-configured dual banks is being requested and/or initiated while an ongoing memory modify operation is being performed in the same one of the dual banks, in response status information regarding the ongoing memory modify operation is provided to data I/O pins 14, instead of the data requested. As can be seen, read data relating to the requested memory read operation is not provided to data pins 14.

In particular, control circuit 15 may include or be associated with a status generation circuit 30 capable of monitoring the progress or state of the ongoing memory modify operation and generating a value indicative of the monitored state. The output of status generation circuit 30 is connected to a second input of multiplexer circuit 29. Control circuit 15 may further include or be associated with compare circuitry 31 for determining whether the user-configured dual bank in which the memory read operation is to be performed is in the same user-configured dual bank in which the ongoing memory modify operation is being performed. The address for the requested memory read operation and the address for the ongoing memory modify operation are provided as inputs to compare circuit 31. Compare circuitry 31 additionally receives the output of storage elements 10 so as to provide bank configuration information to compare circuitry 31. Upon compare circuitry 31 finding that a request for a memory read operation is in a user-configured dual bank in which an ongoing memory modify operation is being performed, compare circuitry 31 controls multiplex circuit 29 so that the output of status generation circuit 30 is connected to data I/O pins 14.

Alternatively, in the event core banks 2 are not grouped into a dual bank configuration by programming storage elements 10, flash memory device 1 may allow memory read operations in any core bank 2 in which a memory modify operation is not being performed. Compare circuitry 31 may determine whether a memory read operation is to be performed in a core bank 2 in which a memory modify operation is being performed, and provide status information to data I/O pins 14 upon a positive determination. In this case, a storage element 10 may be used to indicate whether the use of the dual bank configuration information in the remaining storage elements 10 is to be disabled.

It is understood that flash memory device 1 may include additional circuitry not described above or illustrated in FIG. 2. For instance, flash memory device 1 may include precharge circuitry for precharging the column lines 5 during a memory read operation, and data modify circuitry for providing to column lines 5 externally generated data to be stored in a core bank 2 and utilizing sense amplifiers 9b during memory program and/or memory erase operations.

Figure 3:
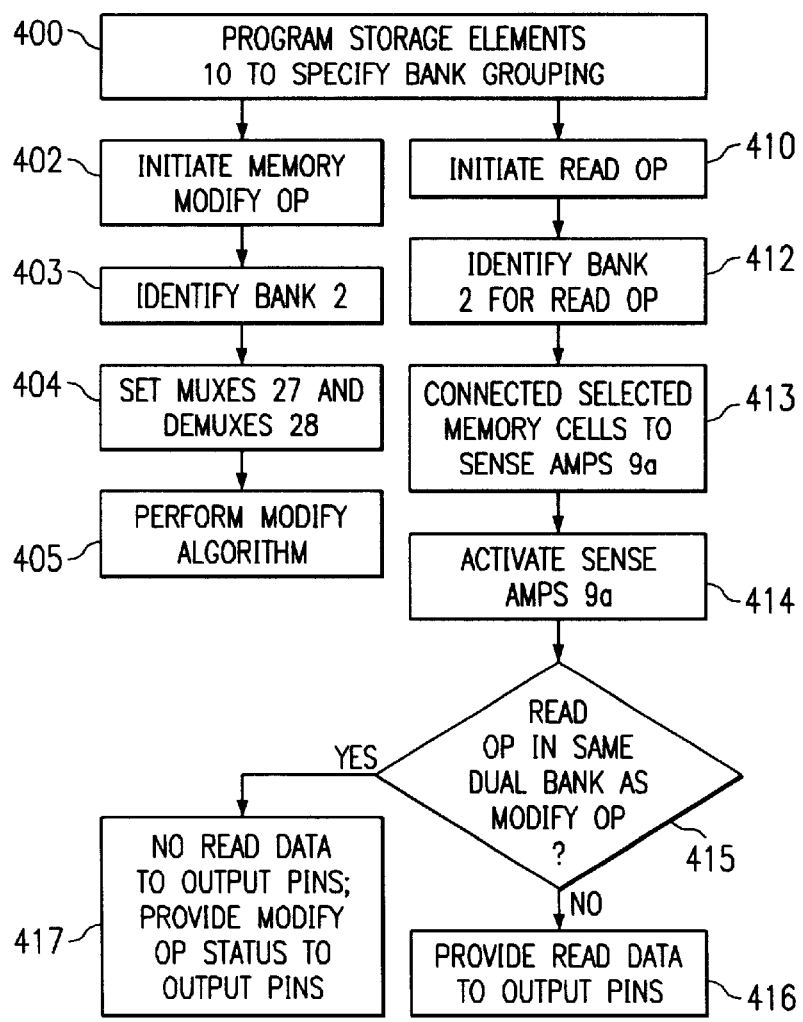
FIG. 3 is a flow chart illustrating an operation of the nonvolatile memory device of FIG. 2.

The operation of flash memory device 1 will be described with reference to FIG. 3. Initially, flash memory 1 may be configured into a dual bank mode at 400 by programming nonvolatile storage elements 10 with values to inform control circuitry 15 as to how the core banks 2 are to be grouped together in forming the two user-configured dual banks.

A memory modify operation is initiated at 402 by input signals applied to flash memory device 1 indicating a memory modify operation is to be performed. Control circuit 15 identifies at 403 the particular core bank 2 in which the memory modify operation is to be performed, and controls the multiplexer circuit 27 and demultiplexing circuit 28 accordingly at 404. At this point, the predecoded address signal 26 (the output of modify predecoder circuit 25) is provided to the identified core bank 2 (via the corresponding row and column decode circuits) and sense amplifiers 9b are connected to columns 5 of the identified core bank 2. In addition, control circuit 15 controls the other multiplexer circuits 27 (i.e., the multiplexer circuits 27 not associated with the identified core bank 2) and the other demultiplexing circuits 28 so as to provide to the unidentified core banks 2 the output of read predecoder circuit 22, and the other demultiplexing circuits 28 so that column lines 5 of the other core banks 2 are coupled to sense amplifiers 9a, respectively. Thereafter, the remaining tasks of the requested memory modify operation are performed at 405.

A memory read operation may be initiated at 410 by input signals applied to flash memory device 1 indicating or requesting that a memory modify operation is to be performed. Column lines 5 of the identified core bank 2 are precharged. At around this same time, control circuit 15 identifies at 412 the particular core bank 2 in which the memory modify operation is to be performed. With the multiplexer circuit 27 corresponding the identified core bank 2 already configured to provide predecoded address signal 23 (the output of read predecoder circuit 22) to the decode circuitry 7 and 8 of identified core bank 2 due to the ongoing memory modify operation, row decode circuit 7 and column decode circuit 8 select the row and columns of the addressed memory cells 20.

At this point, the data values of the addressed memory cells 20 are provided to the column lines 5 within the identified core bank 2. Because the demultiplexing circuit 28 associated with the identified core bank 2 already couples the column lines 5 of the identified core bank 2 to sense amplifiers 9a (due to the ongoing memory modify operation), the data values stored in the selected/addressed memory cells 20 are provided to sense amplifiers 9a at 413. Sense amplifiers 9a are activated at 414 so as to sense a differential between a reference value and the values corresponding to the selected memory cells 20, and to drive output signals to voltage levels based upon the sensed differential. Before data I/O pins 14 are driven to voltage levels corresponding to the output of sense amplifiers 9a, a determination is made at 415 whether the core bank 2 addressed by the memory read operation is the same core bank 2 and/or user-configured dual bank in which an ongoing memory modify operation is being performed. This may include compare circuit 31 comparing the read address from read address buffer 21 with the modify address maintained in modify address counter 24.

In the event that the memory read operation is to be performed in a different dual bank (or core bank 2) as the dual bank (core bank 2) in which the ongoing memory modify operation is being performed, compare circuit 31 controls multiplexer circuit 29 so that the output signals of the first set of sense amplifiers 9a are coupled data I/O circuit 13. At this point, the data stored in the addressed memory cells 20 are provided to data pins 14 of flash memory device 1 at 416.

In the event that the memory read operation is to be performed in the same dual bank (or core bank 2) as the dual bank (core bank 2) in which the ongoing memory modify operation is being performed, control circuit 15 prevents at 417 the data read from appearing at data I/O pins 14. This may be undertaken in a number of ways. Compare circuit 31 controls multiplexer circuit 29 so that the output of status generation circuit 30 (having status information relating to the ongoing memory modify operation) is provided to data I/O circuit 13. At this point, the status of the ongoing memory operation is provided to pins 14 of flash memory device 1.

Figure 4:
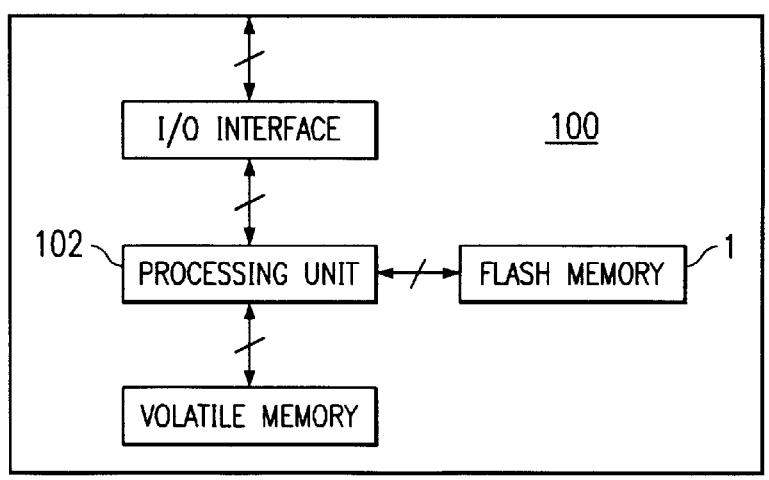
FIG. 4 is a block diagram of an electronics device having therein the nonvolatile memory device of FIG. 2.

It is understood that flash memory device 1 may be utilized in any of a number of devices or systems requiring nonvolatile memory. For instance, flash memory device 1 may be located in an electronics system 100 (FIG. 4) having a processing unit 102 that accesses data stored in flash memory device 1. System 100 may be, for example, a computer and/or data processing device, or a telecommunications device, such as a wireless telephone.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile memory device, comprising:
   more than two core banks of nonvolatile memory cells, memory cells in each core bank being arranged in addressable rows and columns of nonvolatile memory cells;
   a plurality of address decode circuits, each core bank of nonvolatile memory cells being associated with a distinct address decode circuit so as to connect addressed memory cells to a plurality of column lines in the core bank of nonvolatile memory cells;
   a plurality of sense amplifiers coupled to the column lines;
   data output circuitry connected to sense output signals generated by at least some of the sense amplifiers;
   nonvolatile storage elements capable of maintaining memory bank configuration information;
   control circuitry for grouping the core banks of nonvolatile memory cells into at least two groups of one or more core banks based upon the memory bank configuration information, and controlling the address decode circuits, sense amplifiers and the data output circuitry so that memory access operations are capable of being substantially simultaneously performed on the groups of core banks.

2. The nonvolatile memory device of claim 1, wherein:
   the control circuitry allows a memory read operation to be performed on nonvolatile memory cells in any group of one or more core banks while a memory modify operation is being performed on nonvolatile memory cells in another group of one or more core banks.

3. The nonvolatile memory device of claim 1, wherein:
   a first group is formed by at least two core banks of nonvolatile memory cells; and
   the control circuitry prevents the nonvolatile memory device from providing read information from a first of the at least two core banks of the first group in the event a memory operation is already being performed in a second of the at least two core banks of the first group.

4. The nonvolatile memory device of claim 1, wherein:
   in the event the nonvolatile memory device is performing a memory modify operation in a first group of one or more core banks, the control circuitry and the data output circuit cooperate to provide a status of the memory modify operation in response to a request for a memory read operation in the first group of one or more core banks.

5. The nonvolatile memory device of claim 1, wherein:
   the sense amplifiers include a first group of sense amplifiers dedicated to performing sense amplification in memory read operations on any of the core banks, and a second group dedicated to performing sense amplification in memory modify operations on any of the core banks.

6. The nonvolatile memory device of claim 5, further comprising:
   demultiplexing circuitry having inputs coupled to column lines in the core banks and outputs connected to the first and second groups of sense amplifiers, connections between the inputs and the outputs being controlled by the control circuitry.

7. The nonvolatile memory device of claim 5, further comprising:
   circuitry for monitoring the status of an ongoing memory modify operation, an output of the circuitry for monitoring being coupled to the data output circuitry; and
   multiplexing circuitry having inputs coupled to the first group of sense amplifiers and the output of the circuitry for monitoring, and an output coupled to the data output circuitry, the control circuitry controlling the multiplexing circuitry and the circuitry for monitoring.

8. The nonvolatile memory device of claim 7, wherein:
   the control circuitry includes compare circuitry for determining whether a memory read address of an initiated memory read operation is directed to a group of one or more core banks in which a memory modify operation is being performed, and controlling the multiplexing circuitry based upon the determination.

9. The nonvolatile memory device of claim 8, wherein:
   the nonvolatile storage elements generate signals that are input to the compare circuitry.

10. The nonvolatile memory device of claim 1, further comprising:
    read address circuitry having an input coupled to address input pins of the nonvolatile memory device and an output providing a predecoded address value corresponding to a memory read operation;
    modify address circuitry having an input coupled to the address input pins and an output providing a predecoded address value corresponding to a memory modify operation; and
    a plurality of multiplexer circuits, each multiplexer circuit associated with a distinct core bank of nonvolatile memory cells and having inputs coupled to the output of the read address circuitry and the output of the modify address circuitry and an output coupled to the address decode circuit corresponding to a core bank of nonvolatile memory cells.

11. The nonvolatile memory device of claim 10, wherein the read address circuitry comprises:
    a read address buffer coupled to address input pins of the nonvolatile memory device; and
    a predecoder circuit having an input coupled to an output of the read address buffer and an output providing the predecoded address value corresponding to the memory read operation.

12. The nonvolatile memory device of claim 10, wherein the modify address circuitry comprises:
    an address counter having an input coupled to the address input pins of the nonvolatile memory device and adapted to selectively increment/decrement an address value stored in the address counter; and
    a predecoder circuit having an input coupled to the address counter and an output providing the predecoded address value corresponding to the memory modify operation.

13. The nonvolatile memory device of claim 1, wherein:
    the memory modify operations comprise memory program operations and memory erase operations.

14. The nonvolatile memory device of claim 1, wherein:
    the nonvolatile memory device is a flash memory device.

15. The nonvolatile memory device of claim 1, wherein the nonvolatile storage elements do not form part of a core bank of nonvolatile memory cells.

16. A method of operating a nonvolatile memory device having a plurality of core banks of nonvolatile memory cells, comprising:
    initially maintaining memory bank configuration information corresponding to grouping of the core banks of nonvolatile memory cells;
    grouping the core banks of nonvolatile memory cells based upon the memory bank configuration information so as to form at least two independently accessible groups of one or more core banks that are each capable of having memory read operations and memory modify operations performed on nonvolatile memory cells therein; and controlling the groups so that a memory read operation is selectively performed on one of the groups of nonvolatile memory cells while a memory modify operation is being performed on another of the groups.

17. The method of claim 16, wherein the step of controlling comprises:

in a group formed by at least two core banks of nonvolatile memory cells, preventing read information from being provided from a first of the at least two core banks of the group in the event a memory operation is already being performed in a second of the at least two core banks of the group.

18. The method of claim 16, wherein the step of controlling comprises:

in the event the nonvolatile memory device is performing a memory modify operation in a first core bank of a group, providing a status of the memory modify operation in response to a request for a memory read operation in a second core bank in the group.

19. The method of claim 16, wherein:

the nonvolatile memory device comprises a plurality of sense amplifiers; and the step of controlling comprises grouping the sense amplifiers into a first group of sense amplifiers dedicated to only performing sense amplification in memory read operations on any of the groups, and a second group of sense amplifiers dedicated to only performing sense amplification in memory modify operations on any of the groups.

20. The method of claim 19, wherein the step of controlling further comprises:

during a memory modify operation, selecting addressed columns in a group of core banks of nonvolatile memory cells and connecting the selected columns to the second group of sense amplifiers.

21. The method of claim 19, wherein the step of controlling further comprises:

during a memory read operation, selecting addressed columns in a group and connecting the selected columns to the first group of sense amplifiers.

22. The method of claim 21, further comprising:

during the memory read operation, determining whether the memory read address falls within a group of core banks of nonvolatile memory cells that is performing a memory modify operation; and selectively connecting the output of the first group of sense amplifiers to data pins of the nonvolatile memory device based upon the determination.

23. The method of claim 22, further comprising:

monitoring the status of an ongoing memory modify operation; and selectively providing to data pins of the nonvolatile memory device the status of the ongoing memory modify operation, based upon the determination.

24. The method of claim 16, wherein:

the memory modify operations comprise memory program operations and memory erase operations.

25. The method of claim 16, wherein the step of initially maintaining comprises storing, in a nonvolatile manner, the memory bank configuration information.

26. A nonvolatile memory device, comprising:

more than two core banks of nonvolatile memory cells, memory cells in each core bank being arranged in addressable rows and columns of nonvolatile memory cells, and each column of memory cells in a core bank being coupled to a distinct column line in the core bank, the more than two core banks being user configurable into two groups of core banks;

a plurality of address decode circuits, each address decode circuit being associated with a distinct core bank of nonvolatile memory cells and adapted to connect addressed memory cells to a plurality of column lines in the core bank of nonvolatile memory cells associated with the address decode circuit;

a plurality of sense amplifiers coupled to the column lines in the core banks;

data output circuitry connected to sense output signals generated by a first set of sense amplifiers;

control circuitry for receiving input control signals and selectively controlling execution of memory read and memory modify operations on nonvolatile memory cells in any of the core banks, a memory read operation being capable of being performed in any group of core banks in which a memory modify operation is not being performed.

27. The nonvolatile memory device of claim 26, further comprising:

a plurality of storage elements capable of storing memory bank configuration information, the core banks being configured into the first and second groups based upon the memory bank configuration information stored in the storage elements.

28. The nonvolatile memory device of claim 26, further comprising:

status generation circuitry for monitoring ongoing memory modify operations and generating status information based upon the monitoring; and wherein the control circuitry provides at data output pins of the nonvolatile memory device the status information in response to a request for performing a memory read operation in the core bank in which an ongoing memory modify operation is being performed.

29. The nonvolatile memory device of claim 28, further comprising:

compare circuitry for determining whether a memory read operation is to occur in a core bank in which an ongoing memory modify operation is being performed; and multiplexing circuitry having inputs coupled to outputs of at least some of the sense amplifiers and an output of the status generation circuitry, and an output connected to the data output circuitry.

30. The nonvolatile memory device of claim 26, wherein:

the sense amplifiers are divided into a first set and a second set, the first set of sense amplifiers being dedicated to performing sense amplification in memory read operations in any core bank and the second set of sense amplifiers being dedicated to performing sense amplification in memory modify operations in any core bank.

31. The nonvolatile memory device of claim 27, wherein the plurality of storage elements are separate from the more than two core banks of nonvolatile memory cells.

32. A nonvolatile memory device, comprising:

more than two core banks of nonvolatile memory cells, memory cells in each core bank being arranged in addressable rows and columns of nonvolatile memory cells, and each column of memory cells in a core bank being coupled to a distinct column line in the core bank;

a plurality of address decode circuits, each address decode circuit being associated with a distinct core bank of nonvolatile memory cells and adapted to connect addressed memory cells to a plurality of column lines in the core bank of nonvolatile memory cells associated with the address decode circuit;

a plurality of sense amplifiers coupled to the column lines in the core banks, the sense amplifiers are divided into a first set and a second set, the first set of sense amplifiers being dedicated to performing sense amplification in memory read operations in any core bank and the second set of sense amplifiers being dedicated to performing sense amplification in memory modify operations in any core bank;

data output circuitry connected to sense output signals generated by a first set of sense amplifiers;

control circuitry for receiving input control signals and selectively controlling execution of memory read and memory modify operations on nonvolatile memory cells in any of the core banks, a memory read operation being capable of being performed in any core bank in which a memory modify operation is not being performed; and demultiplexing circuitry associated with each core bank and connected to addressed column lines therein, the demultiplexing circuitry selectively connecting an addressed column line to a sense amplifier in any of the first and second groups of sense amplifiers, based upon the type of memory operation being performed in the core bank in which the addressed column is located.

33. The nonvolatile memory device of claim 26, wherein: the nonvolatile memory cells are flash memory cells.

34. An electronics device, comprising:

a processing element; and a nonvolatile memory device, coupled to the processing element, comprising:

more than two core banks of nonvolatile memory cells, memory cells in each core bank being arranged in addressable rows and columns of nonvolatile memory cells, and each column of memory cells in a core bank being coupled to a distinct column line in the core bank;

a plurality of address decode circuits, each address decode circuit being associated with a distinct core bank of nonvolatile memory cells and adapted to connect addressed memory cells to a plurality of column lines in the core bank of nonvolatile memory cells associated with the address decode circuit;

a plurality of sense amplifiers coupled to the column lines in the core banks;

data output circuitry connected to sense output signals generated by a first set of sense amplifiers;

configuration circuitry, programmable or programmed, for maintaining information concerning grouping of the core banks into at least two core bank groups; and control circuitry, coupled to the configuration circuitry, for receiving input control signals and selectively controlling execution of memory read and memory modify operations on nonvolatile memory cells in any of the core banks, a memory read operation being capable of being performed in any core bank group in which a memory modify operation is not being performed.

* * * * *

UNITED STATES PATENT AND TRADEMARK OFFICE
CERTIFICATE OF CORRECTION

PATENT NO. : 6,552,935 B2
DATED : April 22, 2003
INVENTOR(S) : Luca G. Fasoli

It is certified that error appears in the above-identified patent and that said Letters Patent is hereby corrected as shown below:

Column 11,
Line 45, replace "in a group and connecting" with -- in a group of core banks of nonvolatile memory cells and connecting --

Signed and Sealed this

Fifteenth Day of February, 2005

JON W. DUDAS
*Director of the United States Patent and Trademark Office*